United States Patent [19]
Adams et al.

[11] Patent Number: 5,745,498
[45] Date of Patent: Apr. 28, 1998

[54] RAPID COMPARE OF TWO BINARY NUMBERS

[75] Inventors: Robert Dean Adams, Essex Junction; John Connor, Burlington; Garrett Stephen Koch, Cambridge; Luigi Ternullo, Jr., Colchester, all of Vt.

[73] Assignee: International Business Machines Corporation, Armonk, N.Y.

[21] Appl. No.: 661,575

[22] Filed: Jun. 11, 1996

Related U.S. Application Data

[63] Continuation-in-part of Ser. No. 398,468, Mar. 3, 1995, Pat. No. 5,535,164.

[51] Int. Cl.$^6$ .................................................. G06F 11/00
[52] U.S. Cl. ............................... 371/21.1; 371/40.1
[58] Field of Search ........................ 371/21.1, 22.1, 371/22.2, 22.5, 40.1; 395/183.01, 183.12, 183.18

[56] References Cited

U.S. PATENT DOCUMENTS

| | | | |
|---|---|---|---|
| 4,433,413 | 2/1984 | Fassang | 371/25 |
| 5,051,997 | 9/1991 | Sakashita et al. | |
| 5,138,619 | 8/1992 | Fasang et al. | |
| 5,173,906 | 12/1992 | Dreibelbis et al. | |
| 5,301,156 | 4/1994 | Talley. | |
| 5,325,367 | 6/1994 | Dekker et al. | 371/21.1 |
| 5,329,471 | 7/1994 | Swoboda et al. | |
| 5,349,587 | 9/1994 | Nadeau-Dostie et al. | |
| 5,351,213 | 9/1994 | Nakashima. | |
| 5,388,104 | 2/1995 | Shirotori et al. | |
| 5,537,621 | 7/1996 | Charlor et al. | 395/182.06 |

OTHER PUBLICATIONS

"Testing Embedded Single and Multi-Port RAMs Using BIST and Boundary Scan," Alves, et al., IMAG/TIMA Laboratory publication, 1992 IEEE.

*Primary Examiner*—Vincent P. Canney
*Attorney, Agent, or Firm*—Calfee, Halter & Griswold LLP

[57] ABSTRACT

A test method and structure is provided to determine the end count of a predetermined succession or series of binary numbers wherein one number and its relation in the succession to the end count number is known. The structure includes a circuit for generating a binary digit output and a device for storing at least a portion of the said one number which preferably is the penultimate number in a sequential series. A succession of binary numbers is generated as output of the circuit. the outputted numbers are compared to the portion of the stored number. A READY signal is outputted when the stored number compares with the outputted number. On a subsequent cycle, a control signal is generated when the generated number following the READY signal corresponds to the end count number. The inventor also contemplates programmable end count numbers.

25 Claims, 4 Drawing Sheets

RAPID COMPARE OF TWO BINARY NUMBERS

RELATED APPLICATION

This is a continuation-in-part of application Ser. No. 08/398,468, filed Mar. 3, 1995, and entitled "BIST Tester for Multiple Memories" Now U.S. Pat. No. 5,535,164.

FIELD OF THE INVENTION

This invention relates generally to the rapid determination of the target number at the end of a succession of numbers, and more particularly to a rapid number comparison to determine the end point in counting a series of numbers. This invention, in even more particular aspects, relates to the determination of a final or target address or a similar type binary number where this address or similar number is at the end of a predetermined or pre-selected sequence of numbers that are incrementally or decrementally counted or otherwise generated in binary form.

BACKGROUND OF THE INVENTION

There are many areas where a comparison of a binary address or other binary number is necessary when this comparison represents the end or end point of a sequence or series of numbers or addresses, and which, when reached, requires that an address or number compare signal be generated which will usually be used to initiate some type of further action or task.

In one environment in which the particular adaptation of the present invention is used, a built-in self test (BIST) state machine is used to test memory on semiconductor chips. In the testing of memories, the BIST machine sequences through a series of memory addresses, at which addresses data is input to or read from various types of memory, with the particular pattern of data being written and read through a sequence of addresses until a final address is reached. At the time the final address is reached, a new task or a new pattern is generated either for the same memory or a different memory being tested, and thus when the address has been reached indicating the end of a particular task or test or test sequence, a signal must be generated which will initiate further action of a different type from that which has been performed during the previous sequence.

A counter is generally utilized to address the memory and normally increments or decrements sequentially through the memory's address space with either the column (bit) or row (word) dimension rippling fastest. Address compare circuitry is usually provided which monitors the address bus and signals the BIST circuitry when the memory's address space is exhausted or that a programmed target address has been reached. The assertion of the Address Compare (AC) signal triggers subsequent logic events in the BIST circuitry such as setting up the next test pattern to be applied to the memory. The earlier in the cycle the AC signal can be generated, the more time available for the downstream logic to evaluate. As memory address fields continue to become wider, the slower the compare operation becomes since more stages of logic are required and the later into the cycle the AC signal is asserted. Also, as system clock speeds continue to increase, it has become more difficult to complete the evaluation of the said downstream logic before the end of the shorter cycle. Hence, there is a need for early generation of the AC signal which is independent of the address width or system cycle time.

One prior art technique (U.S. Pat. No. 5,173,906 Built-In Self Test for Integrated Circuits, Dreibelbis, et al.) compares all address bits simultaneously against the target address and in the same cycle uses the result of that comparison to feed downstream logic. Also during normal memory BIST operation, the address counter starts at address zero and increments through the address space to the memory's last address or decrements from the last address to address zero. However, for characterization (debug), it is convenient to look at a subset of the address space and that is why a programmable maximum address was incorporated into the prior art address comparator circuit. Hence, the said prior art BIST implementation is able to increment from zero to the programmed maximum address or decrement from the programmed target to zero.

The prior art has two problems. First, the real time comparison of the address with the target address delays the assertion of the AC signal by the amount of time required to perform the comparison and this delay increases as the address field widens. The second problem is a concern when BIST is used to debug first pass hardware. After discovering that there is a problem (if one exists) with a memory's address decode system, it is desirable, if possible, to test portions of the memory which are addressable. In this manner, further design errors or mask defects may be uncovered. This is more desirable than doing a fix of the first problem encountered only to find additional problems on second pass hardware which were present in the first pass hardware but not detected due to the initial defect mechanism or design error. For example, if the wordlines which correspond to the lower half of the memory (000000-011111) aren't functioning due to a design error or some other failure mechanism, one would wish to run memory BIST on wordlines 100000-111111 to check for any problems. This isn't possible with the prior art since the minimum address is hardcoded to be address zero (000000). With the prior art, BIST would count up from 000000-111111. This would result in BIST detecting known fails at wordlines 000000-011111. In order to ignore these known fails, the external tester code would have to be modified for each BIST pattern. (The external tester monitors the BIST fail flag.) This code modification can take days to complete. Also, initial hardware of another product might only be addressable in the third quadrant of its address space. This would require modification to the external tester code unique to this product. A simple and quick solution to this problem is the incorporation into the memory BIST circuitry of a programmable minimum address. With both a programmable maximum and minimum address, BIST can be run on any subset of the address space, thereby avoiding those areas of the memory which have understood fails, thus avoiding down time due to code modification.

SUMMARY OF THE INVENTION

A test method and structure is provided to determine the end count of a predetermined succession or series of binary numbers wherein one number and its relation in the succession to the end count number is known. The structure includes a circuit for generating a binary digit output and a device for storing at least a portion of the said one number, which portion is unique with respect to all preceding numbers in the succession. A succession of binary numbers is generated as output of the circuit, which numbers are compared to the portion of said number being stored. A READY signal is outputted when said stored number compares with the counter output. On a subsequent cycle, a control signal is generated when the generated number following said READY signal corresponds to the end count number. The invention also contemplates programmable end count numbers.

DESCRIPTION OF THE PREFERRED EMBODIMENTS

Figure 1:
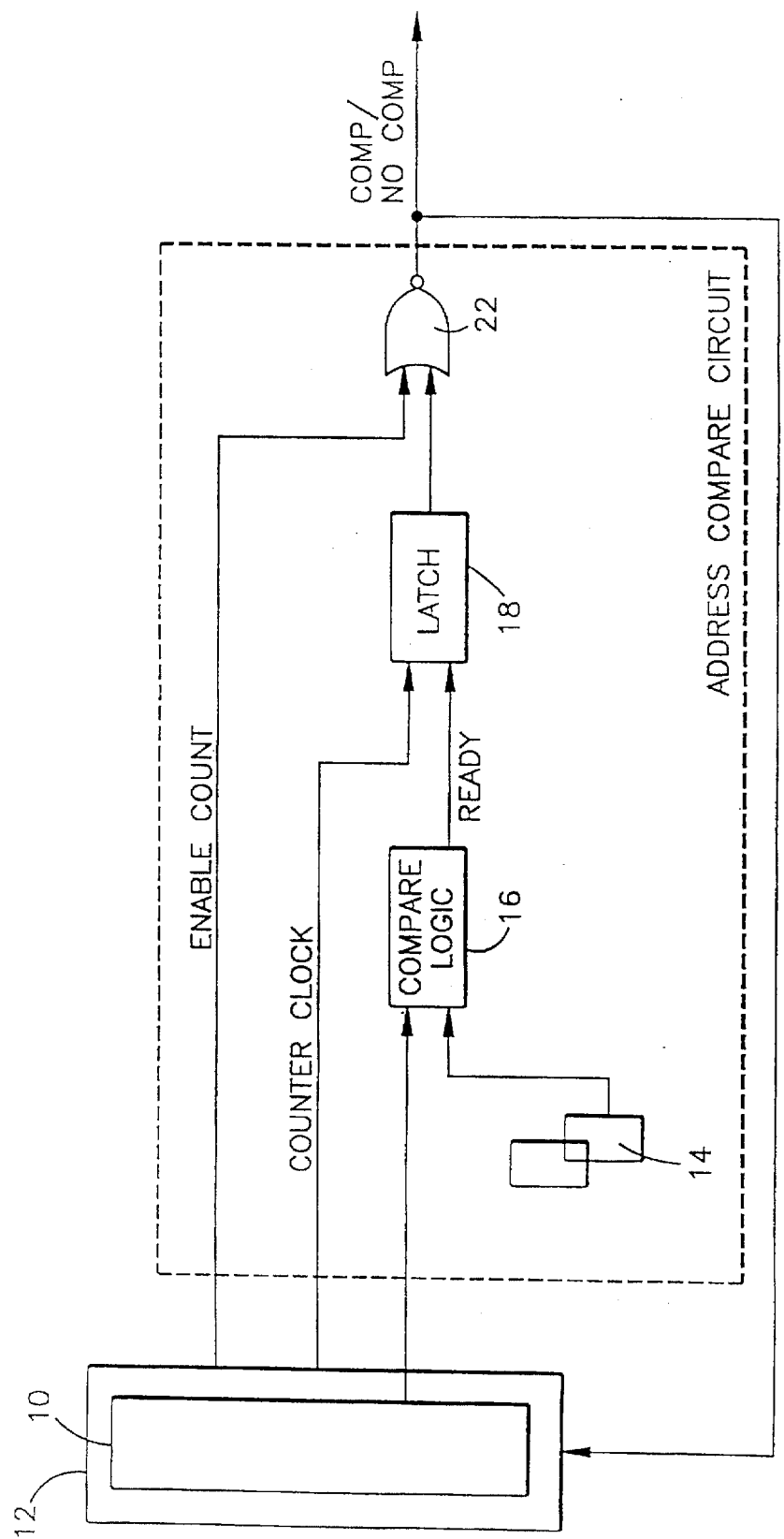
FIG. 1 is a circuit diagram, somewhat schematic, depicting an embodiment of this invention.

Before referring to the drawings in detail, a brief review of the conceptual aspects of the present invention will be presented to aid in the understanding of how the invention is applied and can be applied in various situations and how it reduces the time necessary to make a final compare in a series of numbers.

In determining whether a generated binary number compares with a given predetermined and pre-selected target number, conventional practice indicates that each binary digit in the generated number be compared with each binary digit in the anticipated target number, and if a compare occurs, a compare signal is generated. Conventionally, on each cycle in which a compare is to be made, each of the digits of the generated binary numbers is compared to each of the digits of the target binary number. As is well known in the art, the greater the number of binary digits to be compared, the longer the time that it takes to make a comparison, i.e., it takes a significantly longer period of time to compare a six digit binary number with another six digit binary number than it takes to compare the single digits of two single digit binary numbers. This is so because the logic to compare multiple digit numbers requires a series of comparisons to be made in order to generate a single compare signal; i.e., a series of two bit comparisons is made, these comparisons being cascaded to provide an output signal only when there is a comparison of all of the individual digits. Thus, each increase in the number of binary digits being compared increases the number of cascaded comparisons that must be made, and thus increases the time required for comparison. As indicated above, it is desirable in many instances to have this comparison made very quickly and early during a clock cycle so that the compare signal can be generated early enough that whatever function is being initiated by the compare signal will have sufficient time to execute during the remainder of the cycle and that the address not be so late in the clock cycle that the logic being executed responsive to the address compare signal must cross a clock boundary and thus require an extra clock cycle.

In many instances, including testing memories, address or number compare is not made randomly, but at the end of the sequence of successive binary numbers or other known sequence of numbers such as addresses being generated. The present invention anticipates when the target number is going to be generated in a subsequent cycle by finding a compare in a previous cycle at a known prior number or portion of a prior number in the sequence or series. In instances where a counter generates successive incrementing or decrementing binary numbers, these are utilized such that the generation of the final number or address is anticipated on the previous cycle or previous count, and when the next succeeding cycle or final count of the final number is reached, a signal is generated by either enabling an actuation signal or performing a single bit compare, which can be done very quickly vis-a-vis a multiple bit comparison, thus signalling the end point or final or target number or address has been reached. The determination of the end point is completed very early in this, the final clock cycle, leaving a major portion of the clock cycle time remaining to execute whatever tasks must be executed following the indication of address or number compare. For example, in a BIST tester, this can be moving to the next sequence of tests on a given memory or moving on to tests on a different memory or such other tasks as may be appropriate. Thus, in essence, the present invention makes the multiple bit comparison on a cycle previous to the reaching of the final number and stores this information either by latching or otherwise. Then, when the final number is reached, which in one embodiment is the next successive binary number, a comparison is quickly made and an address compare signal generated early in the clock cycle. Thus, in another embodiment, the entire penultimate number in the series is loaded as the compare number, and when a comparison is made such comparison is stored in a latch. On the next subsequent count, which represents the target number, an AC signal is generated based on the output of the latch and the activation of an enable signal in this final clock cycle. No comparison of a number having a large number of digits is required in this final clock cycle.

A logic circuit which will functionally perform the above functions is shown in FIG. 1. In its basic and simplest form, a bit counter 10 is provided as part of a state machine 12 which can output and either increment or decrement binary numbers bit by bit, and scan chain latches 14 are provided into which the penultimate (the one before the target) number is programmed. The bits from the bit counter 10 and latches 14 are impressed on a bit compare logic circuit 16, where each of the bits is compared. The circuit 16 provides an active low ready output signal to a latch 18 when all of the bits of the programmed penultimate number compare with the output of the counter 10. The output from the latch 18 is provided as one input to NOR gate 22. An enable count (EC) signal from a state machine 12 is provided as the other input to NOR gate 22. The EC signal is also used inside the state machine 12 to gate the counter's 10 clock. When EC is high, the counter is disabled and maintains the present address on its outputs. When EC goes active low, the counter 10 is able to increment or decrement to its next address when clocked. In the parent application, "BIST Tester for Multiple Memories," the frequency of the EC signal was test pattern dependent. EC could go active low every cycle, every second cycle, every fourth cycle, or every eighth cycle. Therefore, the counter's output can remain on the same count for up to eight cycles. The state machine 12 also provides the gated counter clock as the data capture clock to latch 18. Hence, latch 18 doesn't capture the results of the comparison between the programmed penultimate number and the count present on the address bus until the last cycle at the present count when EC goes active low and the counter's clock is asserted. At the start of the next cycle, the counter 10 outputs its next address and latch 18 outputs the value just captured. When both inputs to NOR gate 22 are low, this indicates that there was a successful comparison between the programmed penultimate address and the pervious count and that this is the last cycle at the target count which results in NOR gate 22 output going active high. It should be remembered that the wide compare of the address bits in the bit compare circuit 16 at the penultimate address takes a significantly greater portion of a system cycle than the delay through NOR gate 22 in the final cycle at the target address. This operation is described in more detail and will become more clear in the FIG. 3, Table 1 discussion.

Figure 2:
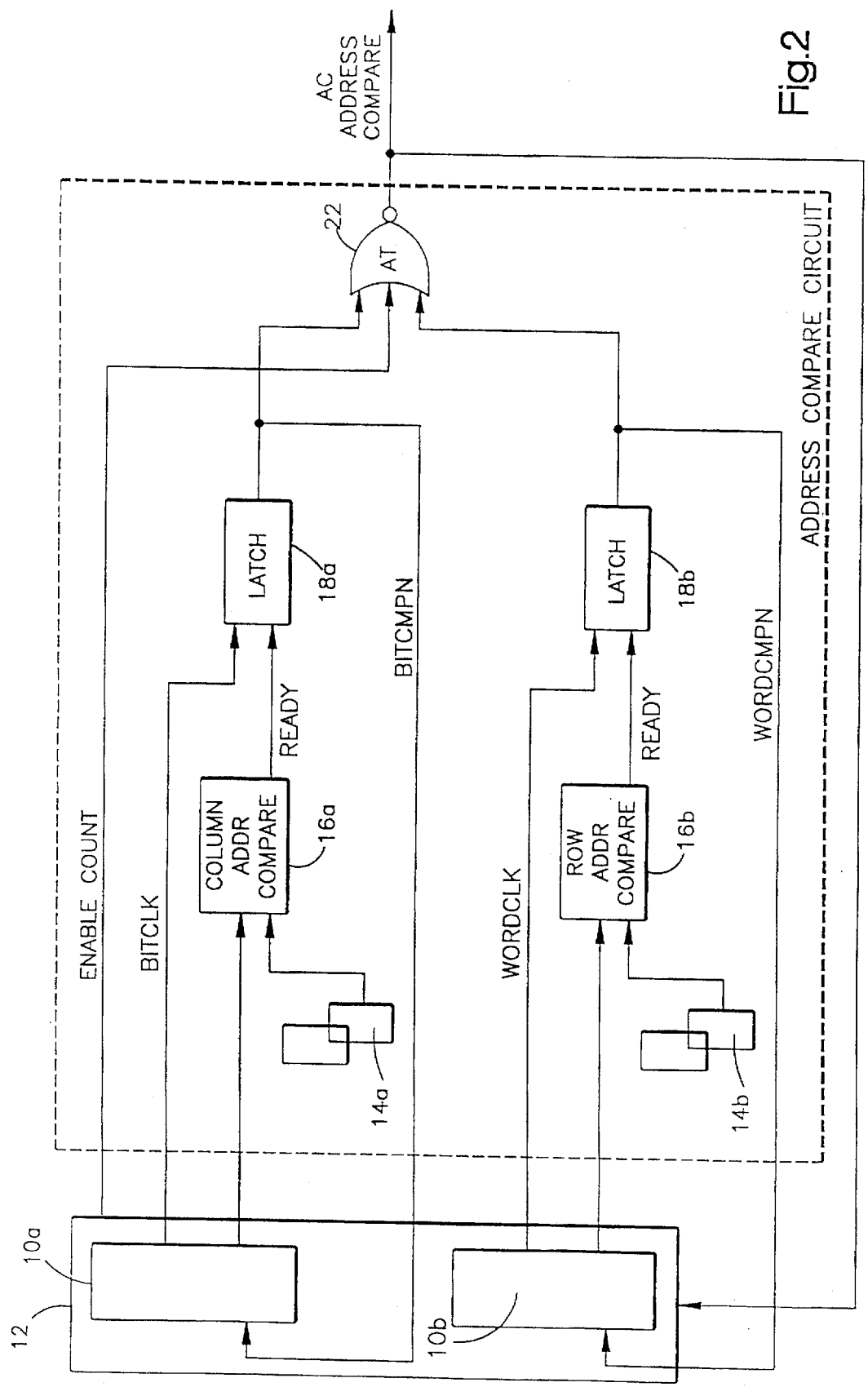
FIG. 2 is a circuit diagram, similar to FIG. 1, showing an embodiment of the invention for detecting target addresses of both the row address and column address in a computer memory.

FIG. 2 is a diagrammatic circuit representation, similar to FIG. 1, indicating how the present invention can be utilized in testing memories where it is necessary to compare both a column address and a row address, sometimes independently and sometimes as a function of each other. As can be seen in FIG. 2, two circuits which are similar to the circuit shown in FIG. 1 are combined so as to provide a comparison of the column address bits and the row address bits. A column address bit counter 10a and a row address bit counter 10b are provided in state machine 12. A column address which constitutes the penultimate number to the target column address is stored in programmable scan chain latches 14a, and the penultimate number to the target row address is stored in programmable scan chain latches 14b. The bits from counter 10a are compared to the bits stored in scan chain latches 14a in bit compare circuit 16a. Column address compare circuit 16a outputs the result of its comparison to latch 18a, the output of which bit compare (BITCMPN) is outputted as one input to NOR gate 22. Similar comparisons are made of the penultimate row address stored in scan chain latches 14b and the output of the row address counter 106 in compare circuit 16b, the output of which is latched in latch 18b. The output of latch 18b, word compare (WDCMPN), is provided as one input to NOR gate 22. BITCMPN and WDCMPN are also fed back to logic in the column address counter 10a and row address counter 10b, respectively. These signals are used along with EC to reset the counters back to their respective starting address after reaching their respective target address. When latches 18a and 18b both output an ACTIVE LOW compare, indicating that there is a compare of both the row and column address penultimate numbers and the ACTIVE LOW enable count signal is impressed on NOR gate 22, NOR gate 22 outputs an ACTIVE HIGH address compare signal indicating the last cycle at the target address of both the column address and the row address. As the third input to NOR gate AT, the EC signal prevents the AC signal from going active high until the last cycle at the target number. For example, if EC is brought active low every fourth cycle, then the counter will remain on the same address for four cycles. While the other two inputs (BITCMPN and WDCMPN) to NOR gate 22 are active low all four cycles at the target address, EC isn't brought active low until the beginning of the fourth cycle at the target address which results in AC going active high during the final cycle of the target address. The EC signal is also used internally by the state machine 12 to gate the assertion of the column counter 10a clock, BITCLK, and the row counter 10b clock, WORDCLK. The state machine provides BITCLK as the data capture clock to latch 18a and WORDCLK as the data capture clock to latch 18b.

This circuit can be programmed to have the count of either the column address counter 10a or the row address counter 10b to reach the final number and hold there, thus outputting a signal indicating a compare and waiting until the other circuit reaches a compare and then generating an output compare signal from NOR gate 22 which is the mode of compare which is required for certain types of tests of memories. Alternatively, the counters can be programmed to reset and continue counting until there is a compare of both the column address and the row address on the same clock cycle which also is required for certain types of memory testing.

The most important thing to note in the compare of the two binary addresses is that the time-consuming comparison of all of the bits, takes place at the count before the final count is reached, thus allowing very quick address compare signal generation in the last clock cycle at the final count with a large amount of the clock cycle time left to perform whatever tasks need to be performed upon generation of the address compare signal.

A more detailed understanding of the operation of a typical address counter used in conjunction with an address comparator is described in U.S. Pat. No. 5,173,906 Built-In Self Test for Integrated Circuits, Dreibelbis, et al. A summary of the address counter/address comparator operation is presented below in Table 1 to aid in understanding the invention. It should be noted, however, that the comparator circuit can be used with other types of counters or number generators (i.e., a microprocessor).

TABLE 1

| DECIMAL COLUMN ADDRESS | BINARY COLUMN ADDRESS | BITCLK | COLUMN COMPARE BITCMPN (ACTIVE LOW) | DECIMAL ROW ADDRESS | BINARY ROW ADDRESS | WORKCLK | ROW COMPARE WDCMPN (ACTIVE LOW) | ENABLE COUNT EC (ACTIVE LOW) | ADDRESS COMPARE AC |
|---|---|---|---|---|---|---|---|---|---|
| 0 | 0000 |   | 1 | 0 | 0000 |   | 1 | 1 | 0 |
| 0 | 0000 | * | 1 | 0 | 0000 |   | 1 | 0 | 0 |
| 1 | 0001 |   | 1 | 0 | 0000 |   | 1 | 1 | 0 |
| 1 | 0001 | * | 1 | 0 | 0000 |   | 1 | 0 | 0 |
| 2 | 0010 |   | 1 | 0 | 0000 |   | 1 | 1 | 0 |
| 2 | 0010 | * | 1 | 0 | 0000 |   | 1 | 0 | 0 |
| 3 | 0011 |   | 0 | 0 | 0000 |   | 1 | 1 | 0 |
| 3 | 0011 | * | 0 | 0 | 0000 | * | 1 | 0 | 0 |
| 0 | 0000 |   | 1 | 1 | 0001 |   | 1 | 1 | 0 |
| 0 | 0000 | * | 1 | 1 | 0001 |   | 1 | 0 | 0 |
| 1 | 0001 |   | 1 | 1 | 0001 |   | 1 | 1 | 0 |
| • | • | • | • | • | • | • | • | • | • |
| 3 | 0011 | * | 0 | 14 | 1110 | * | 1 | 0 | 0 |
| 0 | 0000 |   | 1 | 15 | 1111 |   | 0 | 1 | 0 |
| 0 | 0000 | * | 1 | 15 | 1111 |   | 0 | 0 | 0 |
| 1 | 0001 |   | 1 | 15 | 1111 |   | 0 | 1 | 0 |
| 1 | 0001 | * | 1 | 15 | 1111 |   | 0 | 0 | 0 |

TABLE 1-continued

| DECIMAL COLUMN ADDRESS | BINARY COLUMN ADDRESS | BITCLK | COLUMN COMPARE BITCMPN (ACTIVE LOW) | DECIMAL ROW ADDRESS | BINARY ROW ADDRESS | WORKCLK | ROW COMPARE WDCMPN (ACTIVE LOW) | ENABLE COUNT EC (ACTIVE LOW) | ADDRESS COMPARE AC |
|---|---|---|---|---|---|---|---|---|---|
| 2 | 0010 |   | 1 | 15 | 1111 |   | 0 | 1 | 0 |
| 2 | 0010 | * | 1 | 15 | 1111 |   | 0 | 0 | 0 |
| 3 | 0011 |   | 0 | 15 | 1111 |   | 0 | 1 | 0 |
| 3 | 0011 | * | 0 | 15 | 1111 | * | 0 | 0 | 1 |
| 0 | 0000 | * | 1 | 0  | 0000 |   | 1 | 0 | 0 |
| 1 | 0001 | * | 1 | 0  | 0000 |   | 1 | 0 | 0 |
| 2 | 0010 | * | 1 | 0  | 0000 |   | 1 | 0 | 0 |
| 3 | 0011 | * | 0 | 0  | 0000 | * | 1 | 0 | 0 |
| 0 | 0000 | * | 1 | 1  | 0001 |   | 1 | 0 | 0 |
| ● | ● | ● | ● | ● | ● | ● | ● | ● | ● |
| 2 | 0010 | * | 1 | 15 | 1111 |   | 0 | 0 | 0 |
| 3 | 0011 | * | 0 | 15 | 1111 | * | 0 | 0 | 1 |
| 0 | 0000 | * | 1 | 0  | 0000 |   | 1 | 0 | 0 |
| ● | ● | ● | ● | ● | ● | ● | ● | ● | ● |

Table 1 displays operation of a typical counter used to address, for example, a memory configured as 4 columns by 16 rows. The address counter employed is really two counters, one for column addressing and one for row addressing. The signal BITCLK is used to advance or decrement the column counter from the present column address to the next column address while the signal WORDCLK performs the same function on the row counter. BITCLK and WORDCLK are derived from test pattern dependent control logic, in this case, a Memory BIST State Machine, and gated by the EC signal. The memory's starting address is column 0, row 0. Table 1 shows the column dimension being rippled (incremented) faster. That is, the row counter remains on the same row while the column counter increments from zero to three. (Of course, the address counter could be operated with the row dimension being rippled faster.) BITCLK is only asserted every second cycle in the top portion of Table 1 as notated by the asterisk since EC only goes active low every second cycle. Therefore, the counter remains at each address for two cycles during the present sweep of the address space. This mode of operation can be used, for example, to write the address location in the first cycle and then read back the data in the second cycle before advancing to the next memory location. In the first cycle at column address 3, row address 0, the address comparator output, bit compare (BITCMPN) goes active low. BITCMPN going low informs the control logic and column counter that the column target address has been reached and that the column counter should be reset to its starting address when next clocked. In the second cycle at column address 3, row address 0, BITCMPN is again active low and both BITCLK and WORDCLK are asserted causing the column counter to reset to 0 and the row counter to advance to 1. The address counter continues to increment in this fashion until the first cycle at column address 0, row address 15 where the address comparator output word compare (WDCMPN), goes active low. WDCMPN going low informs the control logic and row counter that the row target address has been reached and that the row counter should be reset to its starting address when next clocked. The address comparator continues to hold WDCMPN low as the address counter advances toward the target address (column 3, row 15). During both cycles at the target address, the address compare circuit drives both BITCMPN and WDCMPN active low. In the second cycle at the target address, EC goes active low, causing AC to go active high and both BITCLK and WORDCLK to be asserted, which in turn causes the address counter to reset to the starting address (column 0, row 0) at the start of the next cycle. The lower portion of Table 1 shows BITCLK being asserted every cycle which causes the counter to remain at an address for only a single cycle during the next sweep of the address space.

Table 1 highlights several points. It demonstrates that the counter can remain at the same address for one or more cycles, the function of BITCLK and WORDCLK, when column (BITCMPN=0), row (WDCMPN=0) and address (AC=1) compares take place, and the gating action of the EC signal.

Figure 3:
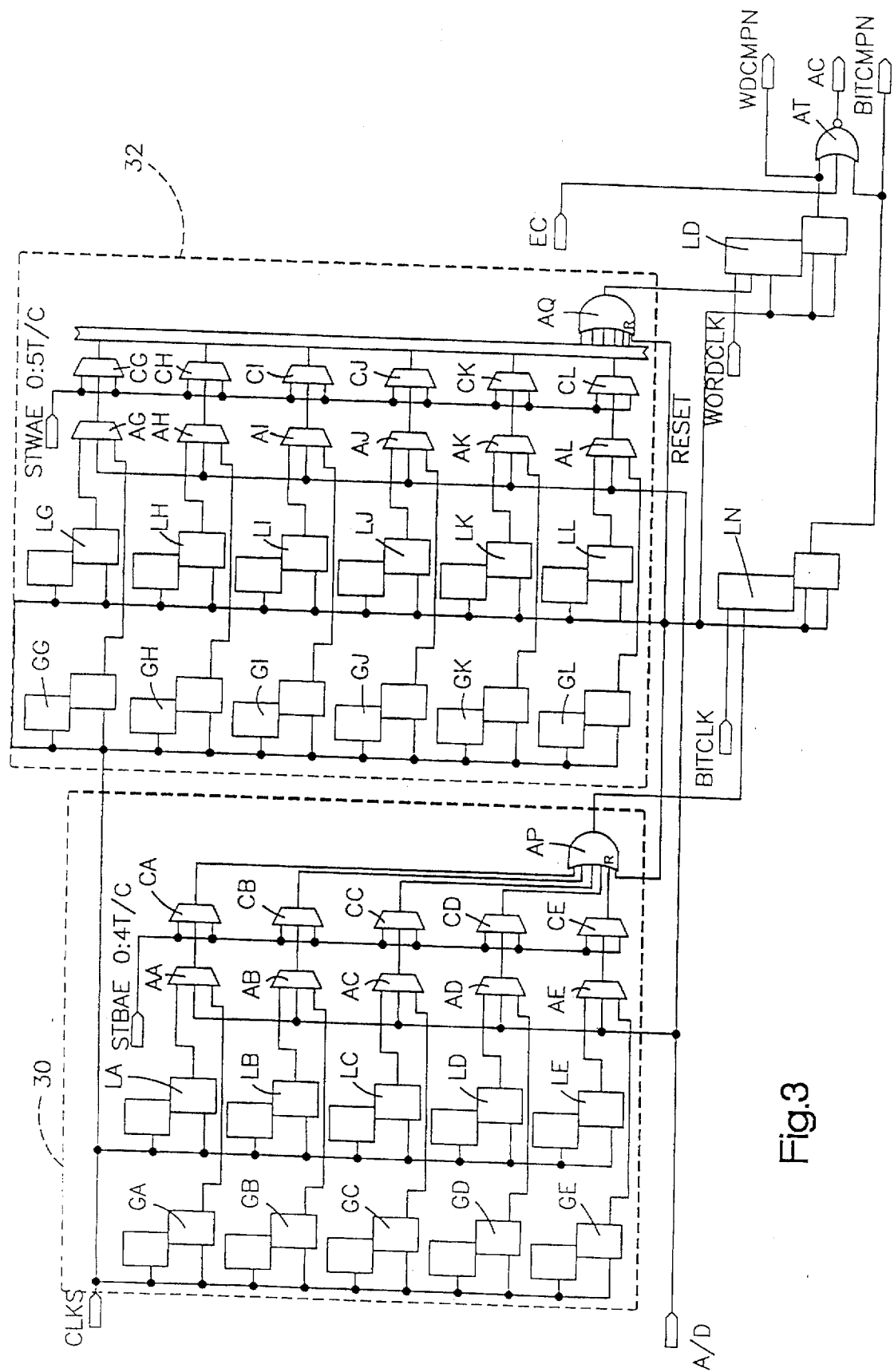
FIG. 3 is a detailed circuit of the embodiment of FIG. 2 for detecting target row and column addresses in testing computer memories.

Referring now to FIG. 3, a more specific circuit implementation of the address compare function for comparing a five bit column address and a six bit row address used for addressing memory and can perform the functions as depicted in Table 1 according to this invention is shown. Moreover, this circuit has programmable numbers for detecting the end point when both incrementing and decrementing. The function of this circuit is substantially the same as that shown in FIG. 2. The column address circuitry is shown in the box 30 and the row address circuitry is shown in the box 32. The column address circuitry includes programmable scan chain latches LA, LB, LC, LD and LE for storing the penultimate numbers for incrementing counts and scan chain latches GA, GB, GC, GD and GE for storing the penultimate numbers for decrementing counts. The row address circuitry contains programmable scan chain latches LG, LH, LI, LJ, LK and LL for storing the penultimate numbers for incrementing counts and scan chain latches GG, GH, GI, GJ, GK and GL for storing the penultimate numbers for decrementing counts. The output of the scan chain latches LA–LL and GA–GL are delivered to multiplexers AA, AB, AC, AD, AE, AF, AG, AH, AI, AJ, AK and AL, respectively. The output from the multiplexers AA–AL are delivered to the select port of two-input multiplexers CA, CB, CC, CD, CE, CF, CG, CH, CI, CJ, CK and CL, respectively. The outputs of multiplexers CA, CB, CC, CD and CE are delivered as inputs to dynamic OR gate AP. The output of OR gate AP is delivered to latch LN, the output of which is delivered as one input to NOR gate AT, the output of which NOR gate AT is the address compare signal indicating a compare of the target address for both the column address and the row address. The outputs from multiplexers CG, CH, CI, CJ, CK and CL are provided as inputs to dynamic OR gate AQ, the output of which is provided as one input to latch LO. The output of latch LO is provided as one input to NOR gate AT. The enable count (EC) signal, from state machine 12 is the third input to NOR gate AT. Bit clock (BITCLK) provides the capture clock to latch LN, and word clock (WORDCLK) provides the capture clock to latch LO. The enable count signal provides a signal to gate AT, the output of which is an address compare (AC) signal.

Operation of the number comparator in FIG. 3 will first be described with reference to sequential binary numbers such as from a counter followed by operation with reference to non-sequential binary inputs.

In the comparator schematic shown in FIG. 3, the True output of programmable latches LA–LL drive the top input on multiplexers AA–AL, respectively, The set of programmable latches GA–GL drive the bottom multiplexer AA–AL input with their True output. The ascend/descend (A/D) signal is connected to the select pin on multiplexers AA–AL, and the outputs of multiplexers AA–AL drive the respective select pin on multiplexers CA–CL. Latches LA–LL hold the programmed count to compare against while A/D=0 (i.e., ascending). Scannable latches LA–LE hold the 5-bit column penultimate count while scannable latches LG–LL hold the 6-bit row penultimate count. Latches GA–GL hold a second programmed count to compare against while A/D=1 (i.e., descending). Scannable latches GA–GE hold the 5-bit column penultimate count while scannable latches GG–GL hold the 6-bit row penultimate count.

The dynamic logic address counter generates the five column address bits STBAE(0:4) and six row address bits STWAE(0:5) as True (T)/Complement (C) pairs which are pre-charged low for a portion of each cycle.

The five column address bits are connected to the five multiplexers CA–CE with the least significant column address (STBAEO) T/C pair connected to multiplexer CA and the most significant column address (STBAE4) T/C pair connected to multiplexer CE. The six row address bits are connected to the six multiplexers CG–CL with the least significant row address (STWAEO) T/C pair connected to multiplexer CG and the most significant row address (STWAE5) T/C pair connected to multiplexer CL.

Multiplexors CA–CL pass either a T (true) or C (compliment) address signal depending on the value of their select pin. When the output of a given multiplexer AA–AL drives a select port on a corresponding multiplexer CA–CL low, the True address signal connected to the top input in the figure is passed through to the multiplexer's CA–CL output. For example, when latch LA contains a logic zero and A/D is zero, the low output of multiplexer AA allows multiplexer CA to pass the T address signal of the column counter's least significant address bit (STBAEOT) as input to OR gate AP. Thus, multiplexer CA performs a passive XOR function between the column counter's least significant bit and the least significant bit of the programmed count. The output of multiplexers CA–CE provide input to dynamic logic OR gate AP. When all inputs to OR gate AP are zero, its active low output PBCN (Penultimate Bits Compare Not) is loaded into latch LN when BITCLK is pulsed high. Latch LN provides the captured signal as input to NOR gate AT via node BITCMPN at the start of the next cycle. The output of multiplexers CG–CL provide input to dynamic logic OR gate AQ. The output of OR gate AQ—the Penultimate Word Compare Not signal (PWCN) is loaded into latch LO when WORDCLK is pulsed high. Latch LO provides this captured signal as input to NOR gate AT via node WDCMPN at the start of the next cycle. An Address Compare (AC) signal is generated at the output of NOR gate AT when WDCMPN, BITCMPN and EC are zero.

The latches used in the address counter (not shown) are dynamic L1L2L4 type latches. The L2 portion of the latch is used only during scan operations. The L4 portion of the latch contains two dynamic logic drivers for sourcing True and Complement signals. When BITCLK or WORDCLK are asserted, data is captured into the L1 portion of the latch. BITCLK and WORDCLK are pulsed high for only a portion of the cycle. After BITCLK and WORDCLK have gone low, a reset clock is pulsed low to reset (force low) both T/C outputs of the L4. A launch clock (P clock) is then pulsed high to pass data in the L1 to the L4 which results in one of the latch's output being driven high. If the data passed into the L4 is a "1", the True output is asserted high while the Complement output remains low. The opposite action occurs if the L4 is loaded with a "0". The assertion of BITCLK actually loads the next address into the L1 portion of the column counter's latches. The new column address isn't made available on the address bus until after BITCLK goes low, the reset clock is pulsed low, and the P clock is asserted. WORDCLK is used in a similar manner to load data into the row counter's latches.

Latches LO and LN in the FIG. 3 address comparator are static L1L2L4 latches. BITCLK loads data into the latch LN and WORDCLK loads data into latch LO. The assertion of the P clock makes available the contents of latch LN and LO. These static logic latches do not receive the reset CLK, and their outputs are not reset.

The number comparator in FIG. 3 receives as input the present address from an address counter and compares that input with a first programmed number when A/D=0. This programmed number is equal to the number which precedes the desired target number. For example, if the target number is 7 (00111) when A/D=0, then the programmed number is 6 (00110). When the counter reaches the penultimate address, the bits of the present count and the first programmed number compare (match) and this result is latched. When the counter is next advanced, the targeted count is reached and an address compare (AC) signal is rapidly generated using the latched comparison from the previous count.

TABLE 2

| | | target = 7 | | | |
|---|---|---|---|---|---|
| start count = 2 | prog. = 00110 | target = 2 | | | |
| start count = 7 | prog. = 00011 | Latch LN | AC | | |
| Decimal Value | Binary Value | BITCLK | PBCN (active low) | Output BITCMPN (active low) | Assumes Word Compare | A/D = 0 A/D = 1 A/D |
| ● | ● | ● | ● | ● | ● | ● |
| 2 | 00010 | | 1 | 1 | 0 | 0 |
| | 00010 | * | 1 | 1 | 0 | 0 |
| 3 | 00011 | | 1 | 1 | 0 | 0 |
| | 00011 | * | 1 | 1 | 0 | 0 |
| ● | ● | ● | ● | ● | ● | ● |
| 6 | 00110 | | 0 | 1 | 0 | 0 |
| | 00110 | * | 0 | 1 | 0 | 0 |
| 7 | 00111 | | 1 | 0 | 0 | 0 |
| | 00111 | * | 1 | 0 | 1 | 0 |
| ● | ● | ● | ● | ● | ● | ● |
| 7 | 00111 | | 1 | 1 | 0 | 1 |
| | 00111 | * | 1 | 1 | 0 | 1 |
| 6 | 00110 | | 1 | 1 | 0 | 1 |
| | 00110 | * | 1 | 1 | 0 | 1 |
| ● | ● | ● | ● | ● | ● | ● |
| 3 | 00011 | | 0 | 1 | 0 | 1 |

TABLE 2-continued

| start count = 2 | prog. = 00110 | | target = 7 target = 2 | | | |
|---|---|---|---|---|---|---|
| start count = 7 | prog. = 00011 | | Latch LN | AC | | |
| Decimal Value | Binary Value | BITCLK | PBCN (active low) | Output BITCMPN (active low) | Assumes Word Compare | A/D = 0 A/D = 1 A/D |
| | 00011 | * | 0 | 1 | 0 | 1 |
| 2 | 00010 | | 1 | 0 | 0 | 1 |
| | 00010 | * | 1 | 0 | 1 | 1 |
| ● | ● | ● | ● | ● | ● | ● |

Table 2 displays the column counter advancing from a starting number of 2 (00010) to the target number of 7 (00111). In this example, it is assumed that the row address is held at its target address and that WDCMPN is held active low. Scannable latches LE–LA are loaded with the of the penultimate number 6 (00110). This results in address signals STBAE(4T, 3T, 2C, 1C, 0T) being passed through multiplexers CE–CA. This condition only allows a compare to occur at address 6. At column addresses 2–5, the output of OR gate AP (PBCN) is high since the five address bits at these counts do not match the five bits of the programmed count. In the second cycle at column address 5, BITCLK is asserted causing latch LN to capture the high output of OR gate AP. In the next cycle, the column counter outputs a 6 onto the address bus. At the same time, latch LN outputs a logic one on node BITCMPN which indicates a "no compare" with the column address on the address. However, at column address 6 there is a compare (match) between the present column address and the programmed count which makes all inputs to OR gate AP low and causes PBCN to go active low. When BITCLK is asserted during the second cycle at column address 6, latch LN captures the low PBCN signal. In the next cycle, the column address counter drives address 7 onto the address bus and latch LN applies an active low BITCMPN via its True output to one input of NOR gate AT. BITCMPN going low informs the control logic and column counter that the column target address has been reached. Since it is assumed in this example that the row address is also at its target address, WDCMPN will also be low and an address compare (AC=1) at the output of NOR gate AT will result in the second cycle at address 7 when EC goes active low. At address 7, node PBCN goes inactive high and this output is captured into latch LN when BITCLK is pulsed high in the second cycle at address 7. This results in BITCMPN going inactive high at the count following the comparison.

After reaching the target number, the counter can be reset to a starting number and again advance to the target number or the counter's direction can be reversed in order to count down to a second target number. When counting down (A/D=1), the present address is compared against a second programmed number (i.e., that number stored in latches GA–GL) whose value is equal to the number before the second target address.

The lower half of Table 2 displays the comparator circuit checking the count present on the address bus against the second programmed count stored in latch GA–GE. The number generator counts down from address 7 toward the second column target number. If it is desired to detect when address 2 is reached, latches GE–GA are programmed with address 3(00011). This allows addresses STBAE (4T, 3T, 2T, 1C, 0C) to pass through multiplexers CE–CA which results in a comparison at address 3—PBCN going active low. In the second cycle at address 3, the low PBCN is loaded into latch LN when BITCLK is asserted. In the next cycle, latch LN drives node BITCMPN low, and in the following cycle, EC goes active low and AC is asserted.

If the counter is not advanced or decremented each cycle, then it is important to clock latches LN and LO with BITCLK and WORDCLK, respectively. For example, if latch LN was clocked every cycle and the counter was advanced every second cycle, then in the first cycle at address 6 in Table 2, latch LN would capture an active low PBCN which would result in BITCMPN going low in the next cycle—the second cycle at address 6 instead of address 7—the intended target.

The comparator circuit achieves performance advantages over the prior art by two methods. First, it performs the full bit comparison at the count preceding the target count and latches that result. This allows a full system cycle to complete a wide bit comparison. Then, at the target address, the latched result from the previous count is used to rapidly generate the address compare signal. Second, the comparator circuit performs a passive comparison as opposed to an active comparison as would occur with an XOR gate where the gate's output switches logic levels after some delay in response to changes at its inputs. The present invention simply uses the latched programmed count to determine which of the two paths is taken through the pass gate multiplexers CA–CL by the present address to the dynamic OR gate inputs. This path is "static" or "DC" since it generally does not change until the AD signal is switched. If any of the inputs to the OR are high, the OR gate output will go high, signalling a miscompare.

Figure 4:
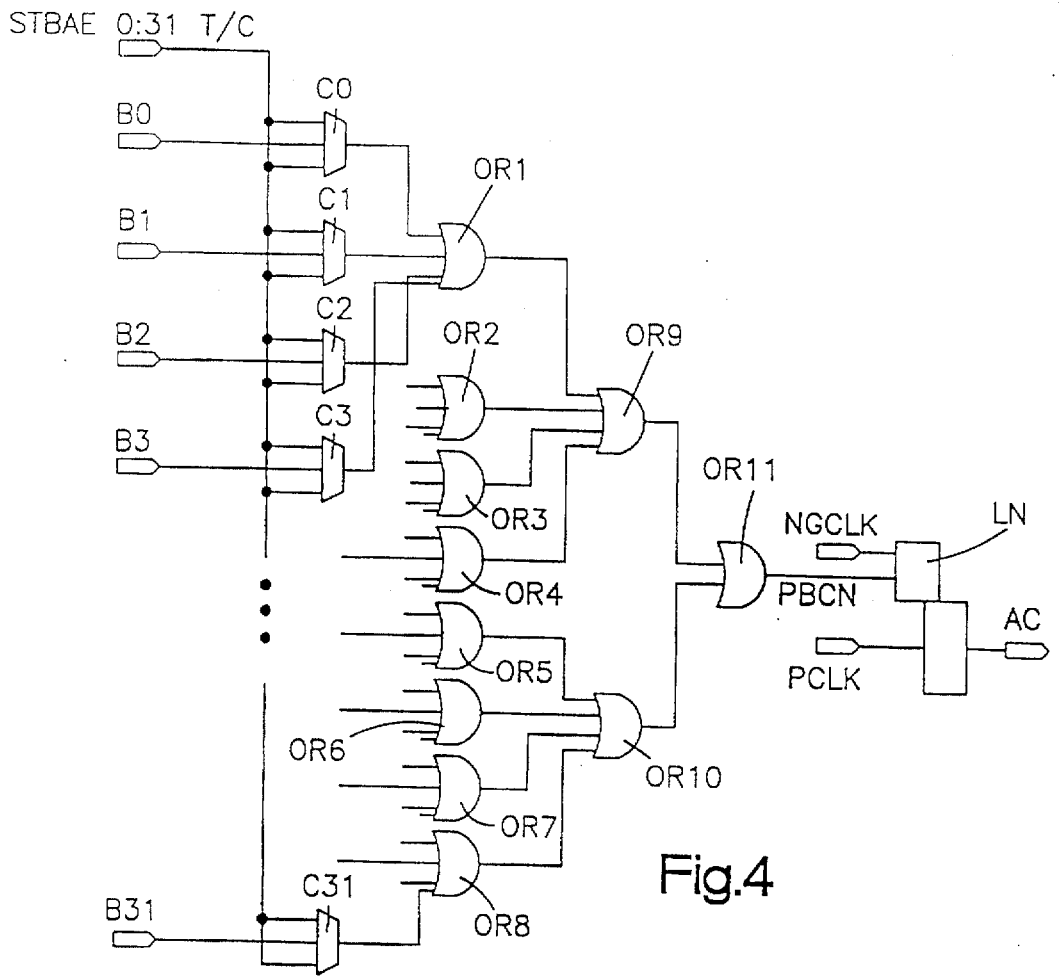
FIG. 4 is a cascaded circuit showing the compare of a 32-bit wide address.

Finally, as the address field widens, the comparator circuit's basic structure can be repeated to accommodate the increased width of the address bus (i.e., the output of first stage OR gates feeding second stage OR gates and so on). For example, in the case of a 32-bit wide address comparator, a portion of which is shown in FIG. 4, the inputs of which are B0–B31, feed multiplexors C0–C31. The first stage is comprised of eight 4-input OR gates OR1–OR8. The second stage is comprised of two 4-input OR gates OR9 and OR10 where each OR gate receives input from four OR gates in the first stage. The third and final stage consists of a single 2-input OR gate OR11 which receives its inputs from the output of OR gates OR9 and OR10, the output of which OR gate OR11 provides input to latch LN.

In addition to the present invention being useful in detecting target numbers in a review of sequential numbers, the comparator can detect a desired target number (AC=1) in a series of non-sequential, binary numbers if the following conditions are true:

1. The number immediately before the target number is known and the penultimate number is programmed into appropriate storage latches in the address compare circuit.
2. The penultimate number is not present elsewhere in the sequence of numbers.
3. The sequence of numbers don't have to be monotonically increasing or decreasing.

If chip area is a concern, the number of latches used for storage of the penultimate numbers can be reduced by half. The compare circuit can be modified to stop at a target address while ascending the address space and at the inverted target address while descending the address space. In this implementation, there is some circuitry to invert the programmed number that address inputs are compared against when the state of the A/D signal is switched. This can be accomplished by simply removing latch gates GA–GL in FIG. 3. Latches LA-LL would drive the top input to multiplexers AA-AL with their True output and the bottom multiplexer input with their Complement output. A partial schematic of this embodiment is displayed in FIG. 5. To explain the operation of this comparator implementation, the discussion below focuses on the 5-bit column side of the comparator circuit used in conjunction with a 5-bit column counter. To detect when the column counter had advanced from 00000 to a target address of 11111, one would load latches LA-LE with the penultimate number (11110). Since A/D is low when the counter is incrementing, the non-inverting output of latches LA-LE would be passed through multiplexers AA-AE, and would drive the select pins on multiplexers CA-CE. This condition would allow STBAEOT to be passed through multiplexers CA and STBAE(1:4)C to be passed through multiplexers CB-CE. Therefore, at address 11110, the inputs to OR gate AP would all be low, causing node PBCN to go low (Table 3).

TABLE 3

| start count = 0<br>start count = 31 | | prog. = 11110<br>prog. = 00001 | tar. = 31<br>tar. = 0<br>Latch LN<br>Output | A/D = 0 |
|---|---|---|---|---|
| Decimal<br>Value | Binary<br>Value | BITCLK | PBCN<br>(active low) | BITCMPN<br>(active low) | A/D = 1<br>A/D |
| 0 | 00000 | * | 1 | 1 | 0 |
| o | oo | o | o | o | |
| 28 | 11100 | * | 1 | 1 | 0 |
| 29 | 11101 | * | 1 | 1 | 0 |
| 30 | 11110 | * | 0 | 1 | 0 |
| 31 | 11111 | * | 1 | 0 | 0 |
| 31 | 11111 | * | 1 | 1 | 1 |
| 30 | 11110 | * | 1 | 1 | 1 |
| 29 | 11101 | * | 1 | 1 | 1 |
| o | oo | o | o | o | |
| 2 | 00010 | * | 1 | 1 | 1 |
| 1 | 00001 | * | 0 | 1 | 1 |
| 0 | 00000 | * | 1 | 0 | 1 |
| 0 | 00000 | * | 1 | 1 | 0 |
| 1 | 00001 | * | 1 | 1 | 0 |
| o | oo | o | o | o | |

At count 11111, the output of latch LN would go low, causing a column count comparison, BITCMPN=0. Continuing the Table 3 example, the A/D signal switches states at the start of the cycle following the column count comparison. A/D switching from a 0 to a 1 causes the inverting output of latches LA-LE to be passed through multiplexers AA-AE which results in the select pins on multiplexers CB-CE being drive high and the select pin on multiplexer CA being driven low. This allows STBAEOC to be passed through multiplexer CA and addresses STBAE(1:4)T to be passed through multiplexers CB-CE. At address 00001, the inputs to OR gate AP all would be low causing node PBCN to go low (lower portion of Table 3). At count 00000, the output of latch LN would go low causing a column count comparison, BITCMPN=0.

Figure 5:
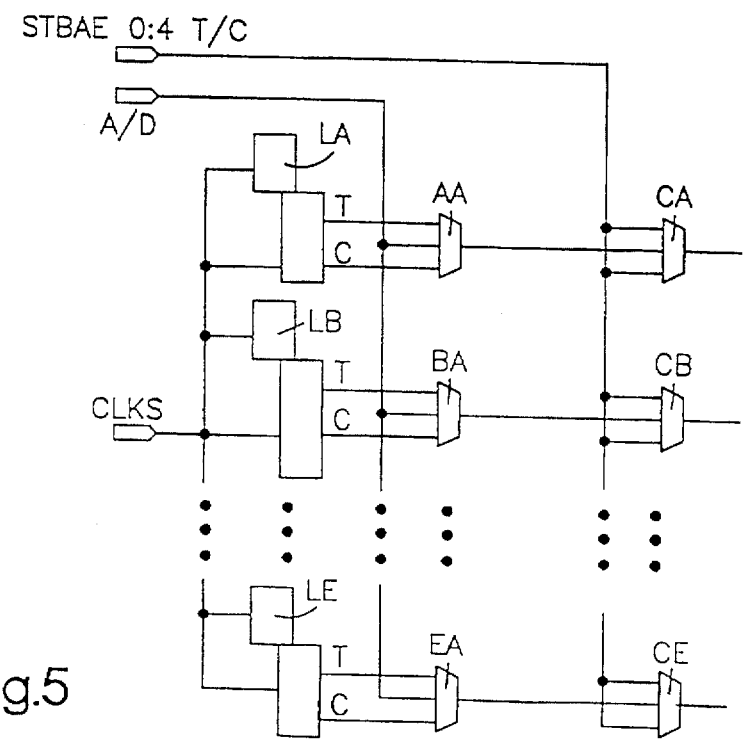
FIG. 5 is an embodiment of the invention wherein a reduced number of components are required.

The FIG. 5 implementation using one set of latches has the following limitations:

1. The counter is restricted to operate in the range between the starting number and its inversion. Using the 5-bit counter example, valid ranges would include 0 (00000) –31 (11111), 1 (00001)–(30 (11110), 2 (00001)–29 (11101), and so forth. One could not, for instance, operate in the range of 0 (00000)–4 (00100) because latches LE-LA would be programmed with 3(00011) which allows a compare at address 4 when A/D=0. However, when A/D=1, the inverted programmed number (11100) is applied to the select pin on multiplexers CE-CA. Under this condition, a compare is generated at address 26 which is clearly outside the intended operating range.

2. To use this method with non-sequential numbers, the penultimate number while A/D=0 and the penultimate number while A/D=1 would have to be exact opposites.

In the FIG. 3 implementation, twice as many storage latches are used as in the FIG. 5 implementation, but this allows two programmable end points which are independent of each other versus less chip area.

An implementation of the invention can be utilized by a microprocessor or other circuitry to detect an end or branch point if the last two numbers in the sequence are known. The microprocessor would control the select ports on multiplexers CA-CL directly, thereby eliminating latches LA-LL and GA-GL and multiplexers AA-AL in FIG. 3. Such an implementation involving the compare of a 32-bit wide number as shown in FIG. 4 is as follows. The microprocessor drives the select ports (B0-B31) on multiplexers C0-C31 with a value equal to the penultimate number. The number generator supplies T/C inputs (STBAE(0:31)) to multiplexers C0-C31 via the address bus. When the sequence of numbers reaches the penultimate number, PBCN goes low and is loaded into latch LN when the number generated is next clocked by NGCLK. This results in an address compare at the target number in the next cycle when the P CLK is asserted. In this implementation, it is assumed that the number generator is clock every cycle (NGCLK is asserted every cycle) and therefore, the address compare signal can be generated directly from the latch LN output. If this is not the case, then a NOR gate with one input driven by latch LN and its other input driven by an enable count signal would be employed to generate the AC signal. Using this implementation, the microprocessor can dynamically change the B0-B31 inputs on the fly as new end points or branch points arise. The important point here is that inputs (B0-B31) from the microprocessor should be stable before arrival of the address bus inputs STBAE(0:31). This ensures that the proper path through the multiplexers C0-C31 is set up, thereby enhancing the speed at which the compares take place and prevents the misfiring of the dynamic OR gate output.

The invention relies on the fact that the series of numbers is known and thus the penultimate number occurs only right before the target number and that latches LN and LO are not clocked until the number generator is incremented/decremented. Also, because the comparison of the bits is latched, a compare will take place at the next count regardless of whether it is the targeted number or not. There is no real time check at the target. Therefore, it must be guaranteed that numbers in series are known.

In another alternative, instead of using a clock pulse to trigger the address compare signal, in the case with a series of consecutive numbers, the least significant bit can be stored in a latch, and this compared with the least significant bit of the counter output and then NANDed with the results of the prior penultimate number comparison. This can be done since in a continuous or consecutive series of binary numbers, the least significant bit of the penultimate number will always be different from the final or target number, and its target number will always follow the penultimate number.

Accordingly, the preferred embodiments of the present invention have been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed is:

1. A method of determining the end count of a predetermined succession of binary numbers generated on successive clock cycles wherein one number and its relation in the succession to the end count number is known, comprising the steps of:

providing a circuit having a binary digit output;

storing at least a portion of one number in said succession which is unique with respect to all preceding numbers in the succession in a storage device and has a known sequential relationship to said end count number;

generating said succession of binary numbers as output of said circuit on successive cycles;

comparing each generated binary number of the circuit output to said portion of said number being stored, and outputting a READY signal when said stored number compares with the number output by said circuit;

and generating a control signal on the cycle when the generated number following said READY signal corresponds to the end count number in the sequence.

2. The method as defined in claim 1 wherein said portion of said one number is at least a portion of the penultimate number.

3. The method as defined in claim 2 wherein the number stored is the penultimate number.

4. The method as defined in claim 1 wherein said portion of said one number constitutes bits of the end count number.

5. The method as defined in claim 1 wherein the numbers are incremented in a known sequence.

6. The method as defined in claim 1 wherein the numbers are decremented in a known sequence.

7. The method as defined in claim 1 wherein the numbers are incremented to give a first end count number and decremented to a second end count number.

8. The method as defined in claim 7 wherein said end count number for the decrementing of the count is hard coded and said end count for incrementing of the count is selectively programmable.

9. The method as defined in claim 7 wherein said first and second end count numbers are each selectively programmable.

10. The method as defined in claim 1 wherein there are two successions of binary numbers, each having an end count, and wherein said control signal is generated responsive to both successions of numbers reaching its respective end count.

11. The method as defined in claim 8 wherein said control signal is generated when both successions of numbers reach their respective end count during the same clock cycle.

12. A method of determining the end count of a succession of binary numbers generated on successive clock cycles, comprising the steps of:

providing a counter having a binary digit output;

storing the end count number in a storage device;

comparing the most significant bits of the counter output to the most significant bits of the end count binary number being stored, and outputting a READY signal when all of the most significant bits of the final binary digit compare with all of the most significant bits of the counter output;

and generating a control signal when the least significant bit of the number following said READY signal has been counted.

13. The method of claim 12 wherein the least significant bits of the stored number and the counter output are compared, and said control signal is generated by the comparison of the least significant bits after the READY signal has been generated.

14. A test circuit for determining the end count of a predetermined succession of binary numbers generated on successive clock cycles wherein one number and its relation in the succession to the end count number is known, comprising:

a binary number generating circuit having a binary digit output of a prescribed succession of binary numbers;

a storage device to store at least a portion of one number in said succession which is unique with respect to all preceding numbers in the succession and has a known sequential relationship to said end count number;

a comparator for comparing at least a portion of each generated binary number of the circuit output to said portion of said number being stored;

a logic circuit to output a READY signal when said stored number compares with the number output by said circuit and generate a control signal on the cycle when the generated number following said READY signal corresponds to the end count number in the sequence.

15. The device of claim 14 wherein said binary number generating circuit includes a counter.

16. The device of claim 14 wherein said logic circuit includes logic to compare the most significant bits of said number generated by said binary number generating circuit, and logic to generate and compare the least significant bits of said stored number and said number generated by said binary number generating circuit and generate said control signal.

17. The test circuit as defined in claim 14 wherein said storage device stores at least a portion of the penultimate number of the succession.

18. The test circuit as defined in claim 17 wherein the entire penultimate number is stored in said storage device.

19. The test circuit as defined in claim 14 including circuitry to increment said binary numbers in a known sequence.

20. The test circuit as defined in claim 14 including circuitry to decrement said binary numbers in a known sequence.

21. The test circuit as defined in claim 14 further including circuitry to generate an incrementing set of numbers and a decrementing set of numbers, and wherein there are first and second storage devices to store each of said at least portion of said one number with respect to said incrementing numbers and said decrementing numbers.

22. The test circuit as defined in claim 21 including circuitry to selectively program said one number with respect to the incrementing count and circuitry to hard code said portion of said one number with respect to the decrementing count.

23. The test circuit as defined in claim 21 including circuitry to selectively program said at least one portion of said one number for each of the incrementing count and the decrementing count.

24. The test circuit as defined in claim 14 including circuitry to generate two independent successions of binary numbers, each having an independent end count, and to generate said control signal when both sequences reach their end count number.

25. The test circuit as defined in claim 24 wherein said circuitry generates said control signal on the same clock cycle.

* * * * *

UNITED STATES PATENT AND TRADEMARK OFFICE
CERTIFICATE OF CORRECTION

PATENT NO. : 5,745,498
DATED : April 28, 1998
INVENTOR(S) : Adams et al.

It is certified that error appears in the above-indentified patent and that said Letters Patent is hereby corrected as shown below:

In the Abstract, the first word of the fourth sentence change "the" to -- The --.

Signed and Sealed this

Twenty-eighth Day of July, 1998

Attest:

BRUCE LEHMAN

*Attesting Officer*          *Commissioner of Patents and Trademarks*